US012672240B2

(12) United States Patent
Yoo et al.

(10) Patent No.: US 12,672,240 B2
(45) Date of Patent: Jun. 30, 2026

(54) FLEXIBLE PRINTED CIRCUIT BOARD, COF MODULE, AND ELECTRONIC DEVICE COMPRISING THE SAME

(71) Applicant: LG INNOTEK CO., LTD., Seoul (KR)

(72) Inventors: Dae Sung Yoo, Seoul (KR); Jun Young Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 198 days.

(21) Appl. No.: 18/384,415

(22) Filed: Oct. 27, 2023

(65) Prior Publication Data

US 2024/0057259 A1 Feb. 15, 2024

Related U.S. Application Data

(63) Continuation of application No. 17/520,855, filed on Nov. 8, 2021, now Pat. No. 11,839,030.

(30) Foreign Application Priority Data

Nov. 12, 2020 (KR) ........................ 10-2020-0150845

(51) Int. Cl.
*H05K 1/11* (2006.01)
*H05K 1/18* (2006.01)
(Continued)

(52) U.S. Cl.
CPC ............. *H05K 1/189* (2013.01); *H05K 1/111* (2013.01); *H05K 1/118* (2013.01); *H05K 1/18* (2013.01);
(Continued)

(58) Field of Classification Search
None
See application file for complete search history.

(56) References Cited

U.S. PATENT DOCUMENTS 6,300,997 B1 10/2001 Saito
7,217,990 B2 5/2007 Chung
(Continued)

FOREIGN PATENT DOCUMENTS

KR 10-2006-0092665 8/2006
KR 10-0618898 9/2006
(Continued)

OTHER PUBLICATIONS

U.S. Office Action dated Mar. 30, 2023 issued in parent U.S. Appl. No. 17/520,855.

*Primary Examiner* — Ishwarbhai B Patel
(74) *Attorney, Agent, or Firm* — KED & ASSOCIATES, LLP

(57) ABSTRACT

A flexible printed circuit board according to an embodiment includes: a substrate; and a circuit pattern disposed on the substrate, wherein the circuit pattern includes a plurality of first circuit patterns, a plurality of second circuit patterns, and a plurality of third circuit patterns, wherein the third circuit pattern includes a third-first pad portion, a third-second pad portion, and a third wiring portion connecting the third-first pad portion and the third-second pad portion, a plurality of fourth wiring portions are disposed between a plurality of third wiring portions, a line width of the third wiring portion is greater than a line width of the fourth wiring portion, and a distance between the third wiring portion and the fourth wiring portion adjacent to the third wiring portion is greater than a distance between the fourth wiring portions.

18 Claims, 7 Drawing Sheets

(51) Int. Cl.

| | | |
|---|---|---|
| *H05K 1/189* | (2026.01) | |
| *H05K 1/02* | (2006.01) | |
| *H05K 1/03* | (2006.01) | |
| *H05K 1/181* | (2026.01) | |

(52) U.S. Cl.
  CPC .......... *H05K 1/0256* (2013.01); *H05K 1/028* (2013.01); *H05K 1/0393* (2013.01); *H05K 1/181* (2013.01); *H05K 2201/10128* (2013.01)

(56) References Cited

U.S. PATENT DOCUMENTS

| | | | | |
|---|---|---|---|---|
| 7,732,933 B2 * | 6/2010 | Chung | .................... | H01L 24/17 |
| | | | | 257/772 |
| 7,768,103 B2 | 8/2010 | Cho et al. | | |
| 7,821,115 B2 * | 10/2010 | Sasaki | ................. | H05K 1/0209 |
| | | | | 361/813 |
| 7,902,647 B2 | 3/2011 | Chung et al. | | |
| 9,913,369 B2 | 3/2018 | Chuo | | |
| 9,922,921 B2 | 3/2018 | Jung et al. | | |
| 2007/0034402 A1 | 2/2007 | Cheng | | |
| 2015/0311148 A1 | 10/2015 | Jung et al. | | |
| 2020/0243452 A1 * | 7/2020 | Lim | ......................... | H05K 3/28 |

FOREIGN PATENT DOCUMENTS

| | | |
|---|---|---|
| KR | 10-2007-0008009 | 1/2007 |
| KR | 10-2015-0123058 | 11/2015 |

* cited by examiner

FLEXIBLE PRINTED CIRCUIT BOARD, COF MODULE, AND ELECTRONIC DEVICE COMPRISING THE SAME

CROSS-REFERENCE TO RELATED APPLICATIONS

This application is a Continuation Application of U.S. patent application Ser. No. 17/520,855 filed Nov. 8, 2021, which claims priority under 35 U.S.C. 119 and 35 U.S.C. 365 to Korean Patent Application No. 10-2020-0150845 filed Nov. 12, 2020, which are hereby incorporated by reference in their entirety.

BACKGROUND

1 Field

An embodiment relates to a flexible printed circuit board, a COF module, and an electronic device including the same. In detail, the flexible printed circuit board may be a flexible printed circuit board for COF.

2. Background

Recently, various electronic products are thin, miniaturized, and lightened. Accordingly, a research for mounting a semiconductor chip at a high density in a narrow region of an electronic device is being conducted in various ways.

Among them, since a chip on film (COF) method uses a flexible substrate, the COF method may be applied to both a flat panel display and a flexible display. That is, since the COF method may be applied to various wearable electronic devices, the COF method is attracting attention. In addition, since the COF method may realize a fine pitch, the COF method may be used to realize a high-resolution display (QHD as the number of pixel increases.

A chip on film (COF) is a method in which a semiconductor chip is mounted on a flexible printed circuit board in the form of a thin film. For example, the semiconductor chip may be an integrated circuit (IC) chip or a large-scale integrated circuit (LSI) chip.

Meanwhile, the flexible printed circuit board may include a plurality of circuit patterns for connecting the chip, a display panel, and a driving printed circuit board. In addition, the plurality of circuit patterns may include a power-applying circuit pattern for applying power to the display panel.

Meanwhile, the power-applying circuit pattern requires a pad portion having a constant width for bonding, and accordingly, the pad portion of the power-applying circuit pattern may be formed to have a larger width than other pad portions.

However, after forming the pad portion of the power-applying circuit pattern, there is a problem that the pad portion protrudes in a direction of another adjacent circuit pattern, or a protruding portion comes into contact with the other circuit pattern to cause a short-circuit.

Therefore, a flexible printed circuit board, a COF module, and an electronic device including the same having a new structure that can solve the above problems are required.

BRIEF DESCRIPTION OF THE DRAWINGS

The embodiments will be described in detail with reference to the following drawings in which like reference numerals refer to like elements wherein.

DETAILED DESCRIPTION

Hereinafter, embodiments of the present disclosure will be described in detail with reference to the accompanying drawings. However, the spirit and scope of the present disclosure is not limited to a part of the embodiments described, and may be implemented in various other forms, and within the spirit and scope of the present disclosure, one or more of the elements of the embodiments may be selectively combined and replaced.

In addition, unless expressly otherwise defined and described, the terms used in the embodiments of the present disclosure (including technical and scientific terms) may be construed the same meaning as commonly understood by one of ordinary skill in the art to which this invention belongs, and the terms such as those defined in commonly used dictionaries may be interpreted as having a meaning that is consistent with their meaning in the context of the relevant art.

In addition, the terms used in the embodiments of the present disclosure are for describing the embodiments and are not intended to limit the present disclosure. In this specification, the singular forms may also include the plural forms unless specifically stated in the phrase, and may include at least one of all combinations that may be combined in A, B, and C when described in "at least one (or more) of A (and), B, and C".

Further, in describing the elements of the embodiments of the present disclosure, the terms such as first, second, A, B, (a), and (b) may be used. These terms are only used to distinguish the elements from other elements, and the terms are not limited to the essence, order, or order of the elements.

In addition, when an element is described as being "connected", "coupled", or "connected" to another element, it may include not only when the element is directly "connected" to, "coupled" to, or "connected" to other elements, but also when the element is "connected", "coupled", or "connected" by another element between the element and other elements.

Further, when described as being formed or disposed "on (over)" or "under (below)" of each element, the "on (over)" or "under (below)" may include not only when two elements are directly connected to each other, but also when one or more other elements are formed or disposed between two elements.

Furthermore, when expressed as "on (over)" or "under (below)", it may include not only the upper direction but also the lower direction based on one element.

Hereinafter, a flexible printed circuit board, a COF module, and an electronic device including the same according to an embodiment will be described with reference to the drawings.

Figure 1:
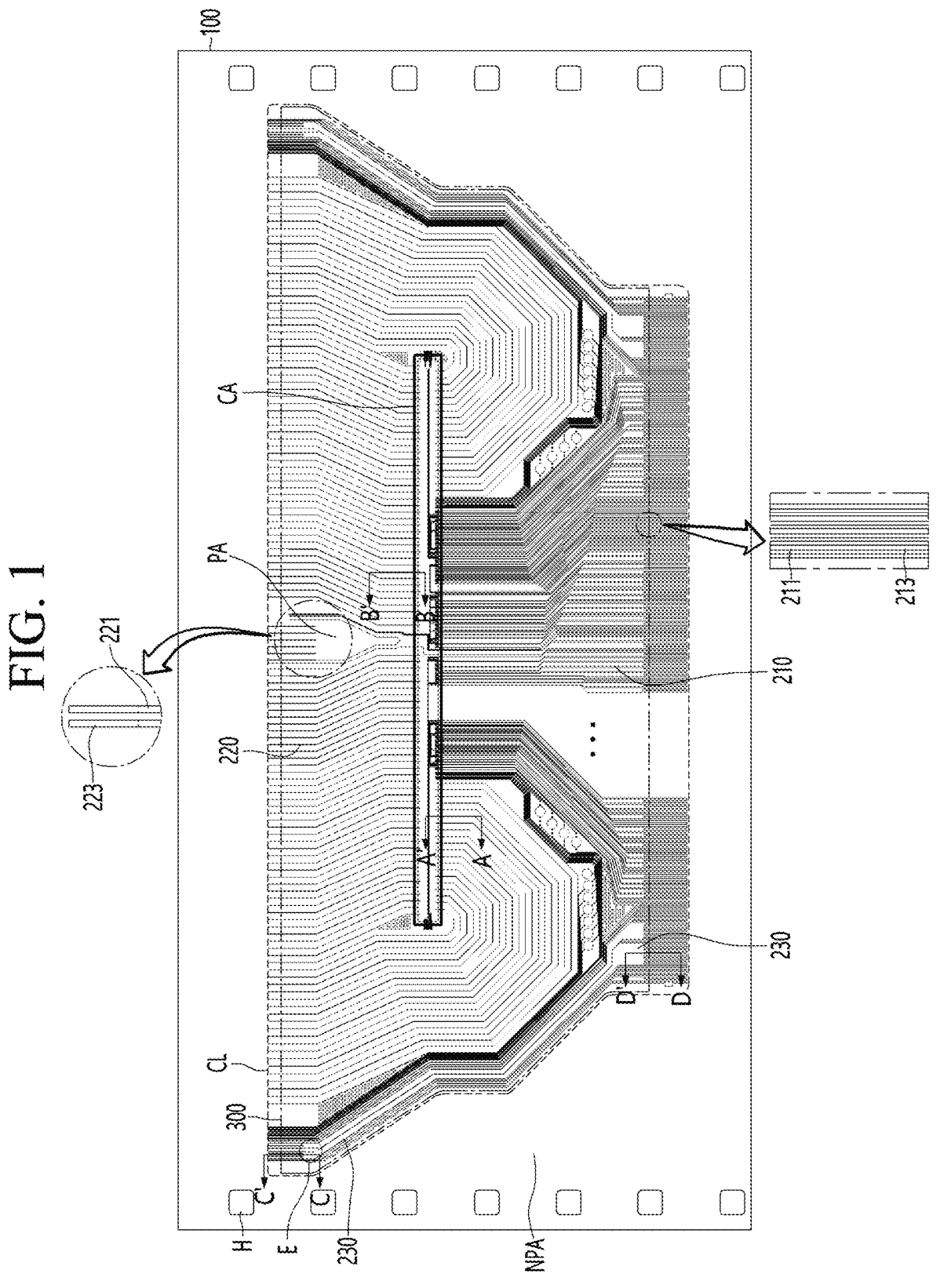
FIG. 1 is a top view of a flexible printed circuit board according to an embodiment.

FIG. 1 is a top view of a flexible printed circuit board according to an embodiment.

Referring to FIG. 1, a flexible printed circuit board 1000 according to the embodiment may include a substrate 100, circuit patterns 210 and 220 disposed on the substrate 100, and a protective layer 300 on the circuit patterns.

The substrate 100 may include a flexible substrate. For example, the substrate 100 may be a polyimide (PI) substrate. However, the embodiment is not limited thereto, and the substrate 100 may include a polymer material such as polyethylene terephthalate (PET), polyethylene naphthalate (PEN), or the like. Accordingly, the flexible printed circuit board including the substrate 100 may be used in various electronic devices having a curved display device. For example, the flexible printed circuit board including the substrate 100 is excellent in flexible characteristics, thereby having suitability of mounting a semiconductor chip on a wearable electronic device.

The substrate 100 may have a thickness of 20 μm to 100 μm. For example, the substrate 100 may have a thickness of 25 μm to 50 μm. For example, the substrate 100 may have a thickness of 30 μm to 40 μm. When the thickness of the substrate 100 exceeds 100 μm, the overall thickness of the flexible printed circuit board may be increased, and accordingly, the flexible characteristics may be deteriorated. In addition, when the thickness of the substrate 100 is less than 20 μm, the substrate 100 may be vulnerable to heat/pressure in a process of mounting a chip.

The substrate 100 may include a pattern region PA and a non-pattern region NPA. For example, the pattern region PA may be a central region of the substrate 100, and the non-pattern region NPA may be an outer region of the substrate 100. That is, the pattern region PA may be surrounded by the non-pattern regions NPA.

A boundary may be formed between the pattern region PA and the non-pattern region NPA by a cutting line CL of the substrate 100. The flexible printed circuit board may be cut through the cutting line CL before or after mounting the chip on the flexible printed circuit board.

The pattern region PA may include a chip mounting region CA. In detail, the pattern region PA may include the chip mounting region CA in which a chip C connected to the circuit pattern is mounted.

In addition, circuit patterns 210, 220, and 230 may be disposed on the pattern region PA. In detail, a plurality of circuit patterns that are spaced apart from each other and extend in multiple directions may be disposed in the pattern region PA.

The circuit pattern may not be disposed in the non-pattern region NPA. That is, the pattern region PA and the non-pattern region NPA may be divided according to the presence or absence of the arrangement of the circuit pattern.

The non-pattern region NPA may include a plurality of holes. In detail, the non-pattern region NPA may include a plurality of sprocket holes H. The flexible printed circuit board may be wound or unwound by the sprocket hole H in a roll-to-roll manner.

The flexible printed circuit board may be processed into the COF module and mounted on various electronic devices after cutting the cutting line CL between the non-pattern region NPA in which the sprocket hole H is formed and the pattern region PA.

The circuit pattern may include a wiring portion and a pad portion. In addition, the plurality of circuit patterns may be disposed in the pattern region PA. In detail, a first circuit pattern 210, a second circuit pattern 220, and a third circuit pattern 230 may be disposed in the pattern region PA.

Figure 2:
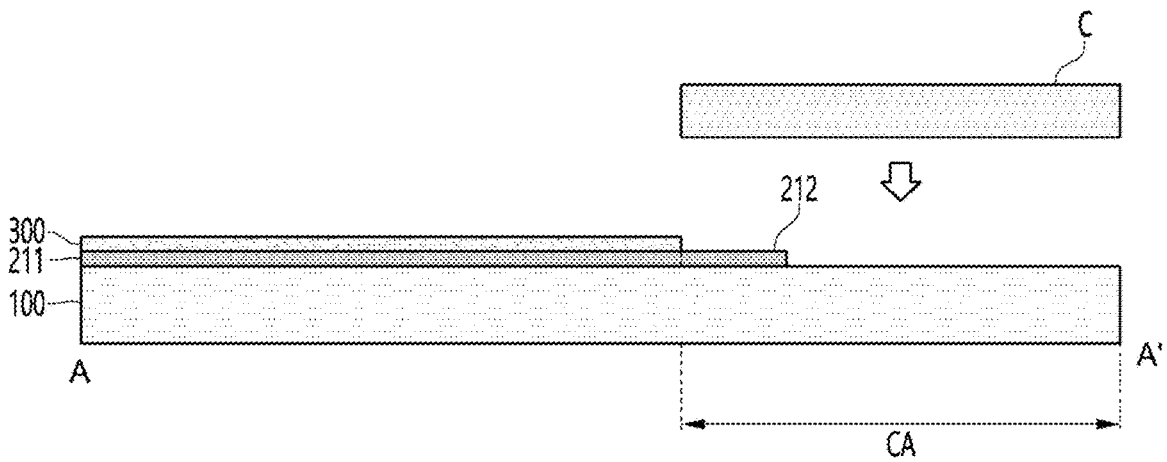
FIG. 2 is a cross-sectional view taken along line A-A' in FIG. 1.

Referring to FIGS. 1 and 2, the first circuit pattern 210 may include a first wiring portion 211, a first-first pad portion 212, and a first-second pad portion 213. In detail, the first circuit pattern 210 may include the first-first pad portion 212 disposed inside the chip mounting region CA, the first-second pad portion 213 disposed outside the chip mounting region CA, and the first wiring portion 211 disposed between the first-first pad portion 212 and the first-second pad portion 213 and connected to the first-first pad portion 212 and the first-second pad portion 213.

The first wiring portion 211, the first-first pad portion 212, and the first-second pad portion 213 may be integrally formed.

In addition, the first wiring portion 211 may be disposed to extend in a first direction D1 based on the chip mounting region CA.

The first-first pad portion 212 may be electrically connected to a chip disposed in the chip mounting region. In addition, the first-second pad portion 213 may be electrically connected to a display panel. In addition, the first wiring portion 211 may transmit a signal between the chip and the printed circuit board.

A protective layer 300 may be disposed on the first circuit pattern 210. In detail, the protective layer 300 may be disposed on the first wiring portion 211. The protective layer 300 may be disposed to surround the first wiring portion 211. In addition, the protective layer 300 may not be disposed on the first-first pad portion 212 and the first-second pad portion 213. Accordingly, the first-first pad portion 212 and the first-second pad portion 213 may be exposed to the outside to be electrically connected to the chip and a terminal of the printed circuit board described above.

Figure 3:
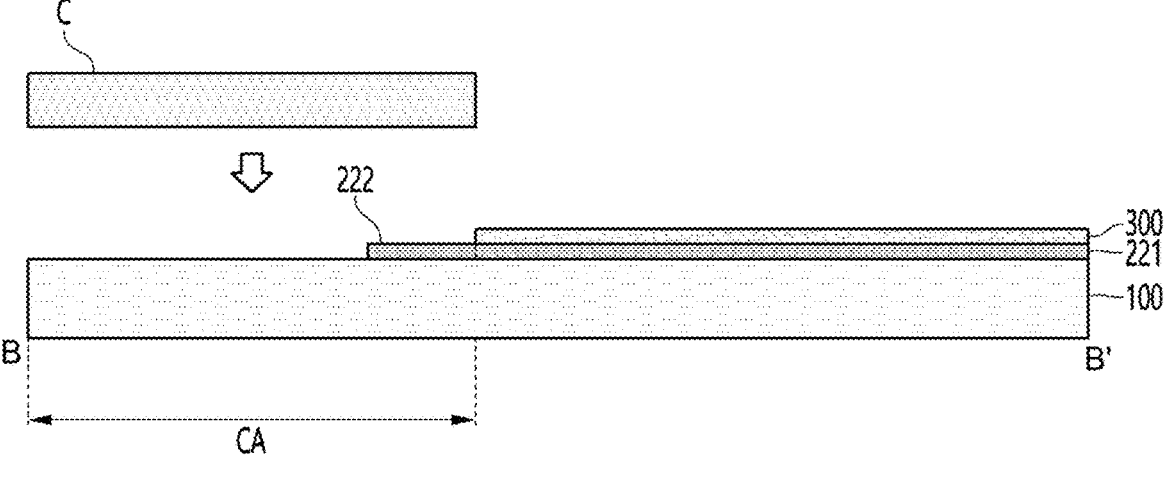
FIG. 3 is a cross-sectional view taken along line B-B' in FIG. 1.

In addition, referring to FIGS. 1 and 3, the second circuit pattern 220 may include a second wiring portion 221, a second-first pad portion 222, and a second-second pad portion 223. In detail, the second circuit pattern 220 may include the second-first pad portion 222 disposed inside the chip mounting region CA, the second-second pad portion 223 disposed outside the chip mounting region CA, and the second wiring portion 221 disposed between the second-first pad portion 222 and the second-second pad portion 223 and connected to the second-first pad portion 222 and the second-second pad portion 223.

The second wiring portion 221, the second-first pad portion 222, and the second-second pad portion 223 may be integrally formed.

In addition, the second wiring portion 221 may be disposed to extend in a second direction D2 based on the chip mounting region CA. In detail, the second wiring portion 221 may be disposed to extend in the second direction D2 opposite to the first direction D1.

The second-first pad portion 222 may be electrically connected to the chip disposed in the chip mounting region. In addition, the second-second pad portion 223 may be electrically connected to a display panel. In addition, the second wiring portion 211 may transmit a signal between the chip and the display panel.

The protective layer 300 may be disposed on the second circuit pattern 220. In detail, the protective layer 300 may be disposed on the second wiring portion 221. The protective layer 300 may be disposed to surround the second wiring portion 221. In addition, the protective layer 300 may not be disposed on the second-first pad portion 222 and the second-second pad portion 223. Accordingly, the second-first pad portion 222 and the second-second pad portion 223 may be exposed to the outside to be electrically connected to the chip and a terminal of the display panel described above.

Figure 4:
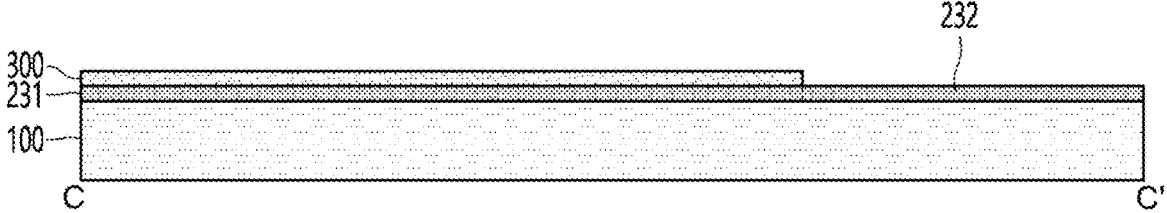
FIG. 4 is a cross-sectional view taken along line C-C' in FIG. 1.
Figure 5:
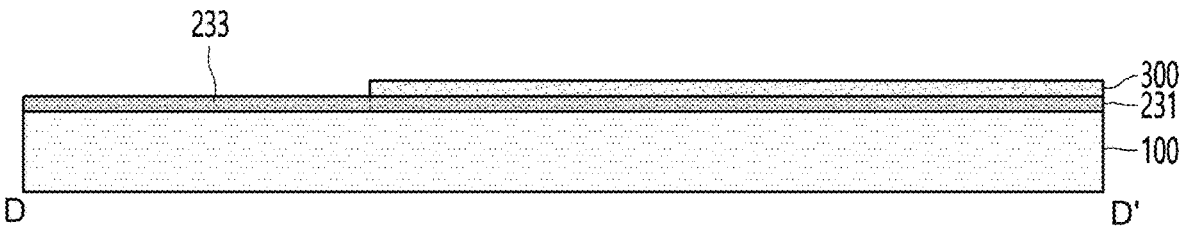
FIG. 5 is a cross-sectional view taken along line D-D' in FIG. 1.

In addition, referring to FIG. 1, FIG. 4, and FIG. 5, the third circuit pattern 230 may include a third wiring portion 231, a third-first pad portion 232, and a third-second pad portion 233. In detail, the third circuit pattern 230 may include the third-first pad portion 232 connected to the display panel, the third-second pad portion 233 connected to the printed circuit board, and the third wiring portion 231 connecting the third-first pad portion 232 and the third-second pad portion 233. That is, the third-first pad portion 232 may be connected to the display panel, and the third-second pad portion 233 may be connected to the printed circuit board.

Accordingly, the display panel and the printed circuit board may be connected through the third circuit pattern 230.

The third wiring portion 231, the third-first pad portion 232, and the third-second pad portion 233 may be integrally formed.

In addition, the third wiring portion 231 may be disposed to extend in the first direction and the second direction based on the chip mounting region CA. In detail, the third wiring portion 231 may be disposed to extend in both the first direction and the second direction.

The protective layer 300 may be disposed on the third circuit pattern 230. In detail, the protective layer 300 may be disposed on the third wiring portion 231. The protective layer 300 may be disposed to surround the third wiring portion 231. In addition, the protective layer 300 may not be disposed on the third-first pad portion 232 and the third-second pad portion 233. Accordingly, the third-first pad portion 232 and the third-second pad portion 233 may be exposed to the outside to be electrically connected to the display panel and the terminal of the printed circuit board described above.

The third circuit pattern 230 may be a power supply circuit pattern. That is, power may be supplied to the display panel through the third circuit pattern 230. In detail, the power applied from the printed circuit board may be supplied to the display panel through the third circuit pattern.

The third circuit pattern 230 may include a region having a line width greater than that of the first circuit pattern 210 and the second circuit pattern 220. In detail, a high current and/or a high voltage may be transferred to the third circuit pattern 230, and the third circuit pattern 230 may include a region having a width greater than that of the first circuit pattern 210 and the second circuit pattern 220 in order to prevent damage to the pattern due to this.

A size and arrangement of the third circuit pattern 230 will be described in detail below.

Referring to FIG. 1, the protective layer 300 may be disposed on the pattern region PA. In detail, the protective layer 300 may be disposed to surround wiring portions of the first circuit pattern 210 and the second circuit pattern 220 and may not be disposed on pad portions. Accordingly, the wiring portion of the circuit pattern may be prevented from oxidation and impact by the protective layer 300, and adhesion between the wiring portion and the substrate may be improved. In addition, the pad portions of the first circuit pattern and the second circuit pattern may be connected to the printed circuit board and the display panel through the pad portion that is exposed without being covered by the protective layer 300.

The protective layer 300 may include a solder resist. For example, the protective layer 300 may include a solder resist including a thermosetting resin, a thermoplastic resin, a filler, a curing agent, or a curing accelerator.

Meanwhile, the first circuit pattern 210, the second circuit pattern 220, and the third circuit pattern 230 may include a metal material having excellent electrical conductivity. In detail, the first circuit pattern 210, the second circuit pattern 220, and the third circuit pattern 230 may include a metal layer including copper (Cu). However, the embodiment is not limited thereto, and the first circuit pattern 210, the second circuit pattern 220, and the third circuit pattern 230 may include a metal layer including at least one metal among copper (Cu), aluminum (Al), and chromium (Cr), nickel (Ni), silver (Ag), molybdenum (Mo), gold (Au), titanium (Ti), and alloys thereof.

The metal layers of the first circuit pattern 210, the second circuit pattern 220, and the third circuit pattern 230 may be formed in a single layer or in multiple layers.

A buffer layer may be disposed between the metal layer and the substrate 100. In detail, the buffer layer including nickel (Ni) and chromium (Cr) on the nickel (Ni) may be disposed between the metal layer and the substrate 100. In detail, after forming the buffer layer including nickel and chromium on the substrate 100 through an electroless plating or sputtering process, the metal layer may be formed on the buffer layer through electroless plating or electrolytic plating. For example, after disposing a metal seed layer on the buffer layer, the metal layer may be formed on the metal seed layer. The buffer layer may have a thin film thickness of nanometers. For example, the buffer layer may have a thickness of 20 nm or less.

Accordingly, it is possible to easily adhere the substrate 100 that is a dissimilar material and the metal layer, and to improve the adhesion of the metal layer.

A plating layer may be further disposed on the second metal layer. The plating layer may serve as an adhesive layer capable of electrically adhering to the chip C. In detail, the plating layer may include tin (Sn).

The plating layer may be formed on the entire wiring portion and pad portion of the circuit patterns. In addition, the plating layer may be formed in one layer or two layers.

The plating layer needs to be a pure plating layer in order to serve as an adhesion to the chip C. To this end, a thickness of the plating layer on the pad portion may be formed to be 0.1 μm or more, 0.2 μm or more, 0.3 μm or more, 0.4 μm or more, 0.5 μm or more, or 10 μm or less.

When the thickness of the plating layer on the pad portion is less than 0.1 μm, when the plating layer is formed, the second metal layer of the circuit pattern, that is, copper is diffused into the plating layer, and a pure tin plating layer may not be formed, and thus an adhesive force with the chip C may be reduced.

In addition, when the thickness of the plating layer exceeds 10 μm, a thickness of the flexible circuit board may be increased.

Accordingly, the plating layer may be formed in one layer with a thickness of 0.1 μm or more, 0.2 μm or more, 0.3 μm or more, 0.4 μm or more, 0.5 μm or more, or 10 μm or less on upper and side surfaces of the circuit pattern, or 0.1 μm or less on the wiring portion of the circuit pattern and may be formed in two layers with a thickness of 0.1 μm or more, 0.2 μm or more, 0.3 μm or more, 0.4 μm or more, 0.5 μm or more, or 10 μm or less. In detail, the plating layer may be thinly formed on the wiring portion of the circuit pattern to prevent cracks due to the plating layer when the flexible circuit board is bent, and the plating layer may be thickly formed on the pad portion to facilitate contact with the chip C.

The first circuit pattern 210, the second circuit pattern 220, and the third circuit pattern 230 may be disposed to have a thickness of 2 μm to 25 μm. For example, the first circuit pattern 210, the second circuit pattern 220, and the third circuit pattern 230 may be disposed to have a thickness of 5 μm to 20 μm. For example, the first circuit pattern 210, the second circuit pattern 220, and the third circuit pattern 230 may be disposed to have a thickness of 7 μm to 15 μm.

Since the first circuit pattern 210, the second circuit pattern 220, and the third circuit pattern 230 is subjected to a process of etching the first metal layer by flash etching performed for separation of the circuit patterns during a manufacturing process, the first circuit pattern 210, the second circuit pattern 220, and the third circuit pattern 230 to be finally manufactured may be smaller than the sum of the thicknesses of the buffer layer, the metal layer, and the plating layer.

When the thickness of the first circuit pattern 210, the second circuit pattern 220, and the third circuit pattern 230 is less than 2 μm, resistances of the first circuit pattern 210, the second circuit pattern 220, and the third circuit pattern 230 may increase. When the thickness of the first circuit pattern 210, the second circuit pattern 220, and the third circuit pattern 230 exceeds 25 μm, it may be difficult to implement a fine pattern.

The first circuit pattern 210, the second circuit pattern 220, and the third circuit pattern 230 may be disposed on at least one of one surface and the other surface of the substrate 100.

For example, the first circuit pattern 210, the second circuit pattern 220, and the third circuit pattern 230 may be disposed on only one of the one surface and the other surface of the substrate 100. That is, the flexible printed circuit board may be a flexible printed circuit board for one-metal COF in which a circuit pattern is disposed on only one surface of the substrate 100.

Alternatively, the first circuit pattern 210, the second circuit pattern 220, and the third circuit pattern 230 may be disposed on both one surface and the other surface of the substrate 100. That is, the flexible printed circuit board may be a flexible printed circuit board for two-metal COF in which all circuit patterns are disposed on both surfaces of the substrate 100.

As described above, the flexible printed circuit board according to the embodiment may include the third circuit pattern 230 for transmitting power to the display panel.

Figure 6:
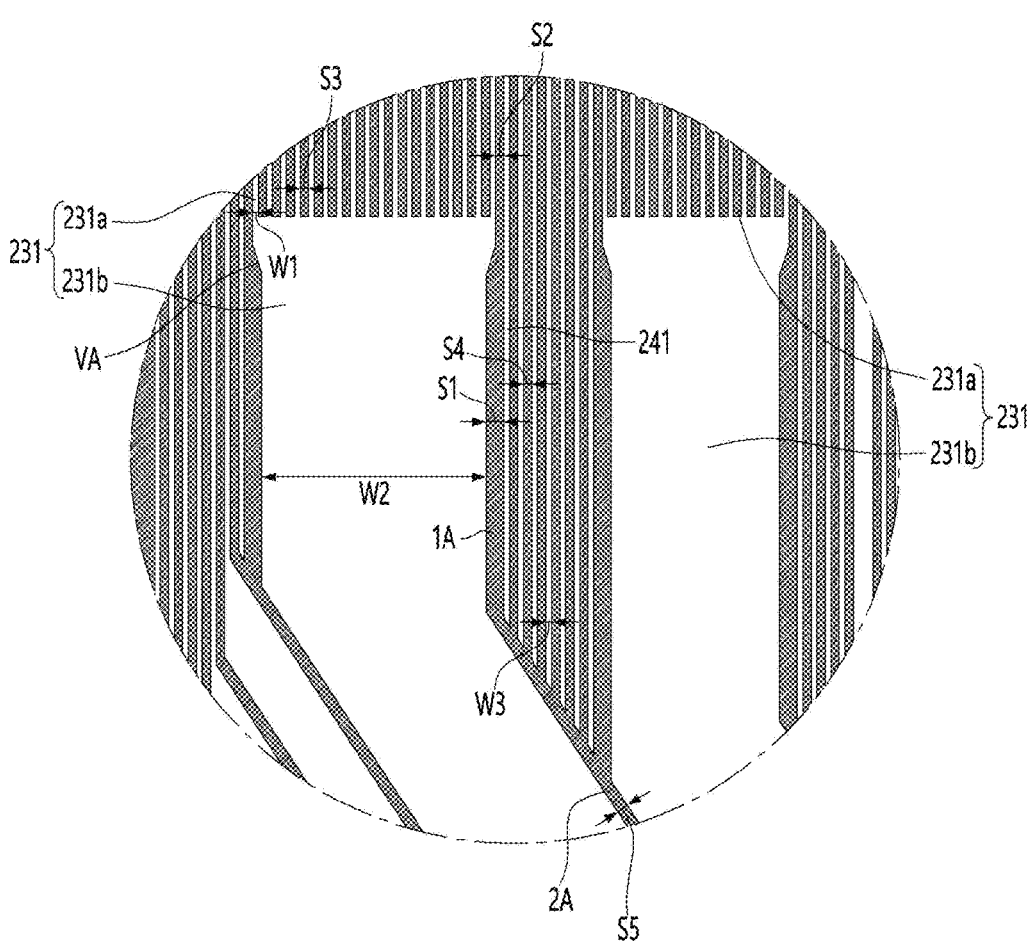
FIG. 6 is an enlarged view of region E in FIG. 1.

FIG. 6 is an enlarged view of region E in FIG. 1. Referring to FIG. 6, the third wiring portion 231 may include a first wiring region 231*a* and a second wiring region 231*b*.

The first wiring region 231*a* and the second wiring region 231*b* may have different line widths. In detail, a line width w2 of the second wiring region 231*b* may be greater than a line width w1 of the first wiring region 231*a*.

For example, the second wiring region 231*b* is a region formed by merging a plurality of first wiring regions, whereby the line width w2 of the second wiring region 231*b* may be greater than the line width w1 of the first wiring region 231*a*. That is, the second wiring region 231*b* may be connected to the plurality of first wiring regions 231*a*. That is, the second wiring region 231*b* may be connected to the plurality of first wiring regions 231*a* integrally formed with the second wiring region 231*b*.

Accordingly, when a current moves through the third circuit pattern 230, it is possible to prevent damage of the third circuit pattern 230 due to a high current and a high voltage.

For example, the line width w2 of the second wiring region 231*b* may be 30 μm or more.

The third wiring portion 231 may include a plurality of third wiring portions 231 spaced apart from each other. Adjacent third wiring portions 231 may be disposed to directly face each other. Alternatively, a fourth wiring portion 241 may be disposed between the adjacent third wiring portions 231. In detail, a plurality of fourth wiring portions 241 spaced apart from each other may be disposed between the adjacent third wiring portions 231.

That is, a first region 1A in which the fourth wiring portion 241 is disposed between the third wiring portions 231 and a second region 2A directly facing the third wiring portion 231 may be included between the adjacent third wiring portions 231.

A width of the first region 1A may be greater than a width of the second region 2A. That is, a width between the adjacent third wiring portions 231 may be narrowed while extending from the third-first pad portion 232 toward the third-second pad portion 233.

One end and the other end of the fourth wiring portion 241 may be short-circuited. That is, the fourth wiring portion 241 may be a dummy wiring portion that is not electrically connected to other circuit patterns, a chip, a display panel, and a printed circuit board.

Line widths of the second wiring region 231*b* of the third wiring portion and the fourth wiring portion 241 may be different. In detail, a line width w3 of the fourth wiring portion 241 may be smaller than the line width w2 of the second wiring region 231*b* of the third wiring portion.

For example, the line width w3 of the fourth wiring portion 241 may be 8 μm or more. In detail, the line width w2 of the second wiring region 231*b* of the third wiring portion may be twice or more the line width w3 of the fourth wiring portion 241.

When the line width w2 of the second wiring region 231*b* of the third wiring portion is less than twice the line width w3 of the fourth wiring portion 241, damage may occur to the third circuit pattern when power is applied due to the decrease in the line width of the third wiring portion.

In addition, the line width w3 of the fourth wiring portion 241 may be equal to or smaller than the line width w1 of the first wiring region 231*a* of the third wiring portion.

The third wiring portion 231 and the fourth wiring portion 241 may be spaced apart from each other. In detail, the third wiring portion 231 and the fourth wiring portion 241 disposed adjacent to each other may be disposed to be spaced apart from each other.

In this case, since the second wiring region 231*b* of the third wiring portion adjacent to the fourth wiring portion 241 has a line width greater than that of the fourth wiring portion 241, there is a problem that a distance between the second wiring region 231*b* of the third wiring portion and the fourth wiring portion 241 is narrowed or the second wiring region 231*b* of the third wiring portion is connected to the fourth wiring portion 241 due to the increase in the line width of the second wiring region 231*b* of the third wiring portion during a process of forming the circuit pattern.

Figure 7:
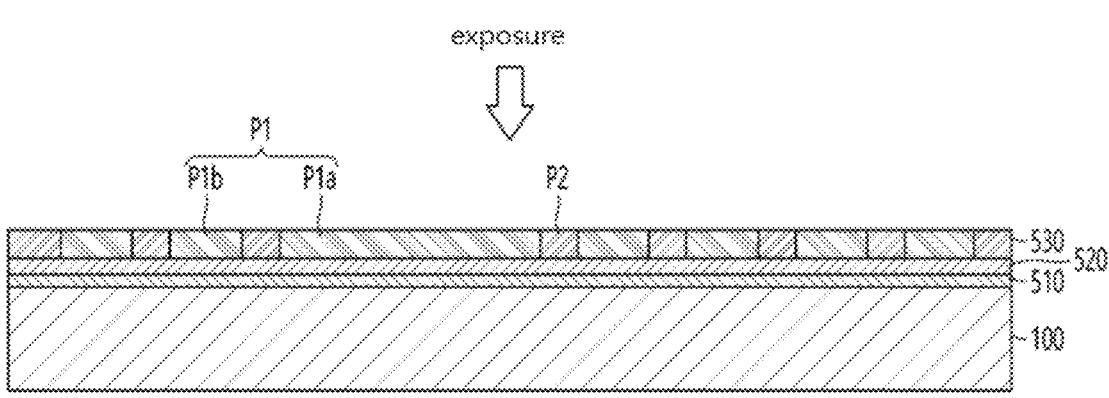
FIG. 7 is a view for describing a circuit pattern forming process of a flexible printed circuit board according to an embodiment.
Figure 7:
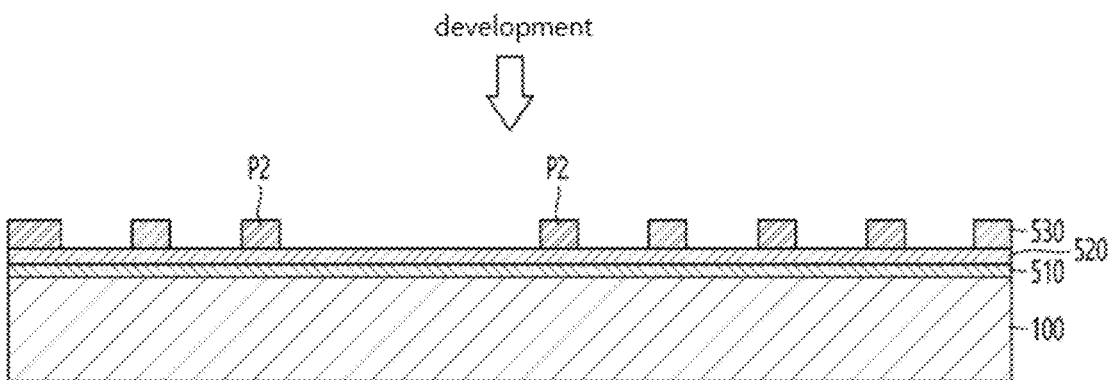

FIG. 7 is a view for describing a process of exposing and developing a photosensitive film among processes of forming a circuit pattern.

Referring to FIG. 7, a buffer layer 510 including nickel and chromium as described above may be disposed on the substrate 100, and a seed layer 520 for plating a metal layer may be disposed on the buffer layer 510.

Subsequently, a photosensitive film 530 for forming a pattern on the seed layer 520 may be disposed on the entire surface of the seed layer 520. Then, a first pattern P1 in which a circuit pattern is formed and a second pattern P2 in which a circuit pattern is not formed on the photosensitive film 530 may be formed by exposing a region in which a circuit pattern is formed on the photosensitive film 530.

Then, the first pattern P1 of the photosensitive film may be removed using a developer.

In this case, a first pattern P1a of the second wiring region of the third wiring portion having a large line width may have a higher developer concentration, amount, or intensity than the first wiring region of the third wiring portion having a small line width and/or a first pattern region P1b of the fourth wiring portion. That is, the first pattern P1a of the second wiring region of the third wiring portion having a large line width may proceed a longer developing process, use a high-concentration developer, use a large amount of developer, or apply a developer at high speed than the first wiring region of the third wiring portion and/or the first pattern region P1b of the fourth wiring portion.

That is, since the first pattern P1a of the second wiring region of the third wiring portion has to remove a relatively large amount of photosensitive film compared to other regions, the intensity and time of the developing process may be greater than when developing other regions.

Accordingly, in the second wiring region of the third wiring portion having a large line width during or after the developing process, a region of the second pattern P2 may collapse, or the region of the second pattern P2 region may be partially or entirely developed.

Accordingly, a line width of the second wiring region of the third wiring portion increases more than a line width set by an exposure pattern, and a distance between the second wiring region of the third wiring portion and an adjacent wiring portion may be decreased, or the second wiring region of the third wiring portion may be connected to the adjacent wiring portion due to the increase in the line width of the second wiring region of the third wiring portion.

Accordingly, as the distance between the second wiring region of the third wiring portion and the adjacent wiring portion is decreased, there is a problem that migration occurs between the second wiring region of the third wiring portion and the adjacent wiring portion, or a short-circuit occurs due to the contact between the second wiring region of the third wiring portion and the adjacent wiring portion.

In order to solve such problems, in the flexible printed circuit board according to the embodiment, the distance between the second wiring region 231b of the third wiring portion disposed in the first region 1A and the adjacent fourth wiring portion 241 may be made larger than those of other wiring portions.

In detail, the second wiring region 232b of the third wiring portion 231 and the fourth wiring portion 241 disposed in the first region 1A may be disposed to be spaced apart at a first distance s1. In addition, the first wiring region 232a of the third wiring portion 231 and the fourth wiring portion 241 may be disposed to be spaced apart at a second distance s2. Further, the first wiring regions 232a of the third wiring portion 231 may be disposed to be spaced apart at a third distance s3. Further, the plurality of fourth wiring portions may be disposed to be spaced apart at a fourth distance s4. Furthermore, the second wiring regions 232b of the third wiring portion 231 disposed in the non-pattern region NPA may be disposed to be spaced apart at a fifth distance s5.

The first distance s1 may be different from at least one of the second distance s2, the third distance s3, the fourth distance s4, and the fifth distance s5. In detail, the first distance s1 may be greater than at least one of the second distance s2, the third distance s3, the fourth distance s4, and the fifth distance s5. For example, a maximum size of the first distance s1 may be greater than the second distance s2, the third distance s3, the fourth distance s4, and the fifth distance s5.

The second wiring region 231b of the third wiring portion 231 may include an inflection region extending in one direction and changing in width. For example, the third wiring portion 231 may include an inflection region VA in which a line width is narrowed while extending from the third-first pad portion 232 toward the third-second pad portion 233 direction.

Accordingly, the distance between the second wiring region 231b of the third wiring portion 231 and the fourth wiring portion 241 may also be changed while extending in the one direction. In detail, a size of the distance between the second wiring region 231b of the third wiring portion 231 and the fourth wiring portion 241 may be increased while extending from the third-first pad portion 232 toward the third-second pad portion 233 by the inflection region VA. The above-described first distance s1 may be defined as a maximum size of the distance between the second wiring region 231b of the third wiring portion 231 and the fourth wiring portion 241.

For example, the maximum size of the first distance s1 may be 18 μm or more. In addition, the second distance s2, the third distance s3, the fourth distance s4, and the fifth distance s5 may be 10 μm or more.

In detail, a size of the first distance s1 may be at least 1.5 times a size of the second distance s2, the third distance s3, the fourth distance s4, and the fifth distance s5.

When the size of the first distance s1 is less than 1.5 times the size of the second distance s2, the third distance s3, the fourth distance s4, and the fifth distance s5, migration or short-circuit may occur in the second wiring region 231b of the third wiring portion and the fourth wiring portion 241.

As the size of the first distance s1 is formed to be larger than the second distance s2, the third distance s3, the fourth distance s4, and the fifth distance s5, the distance between the second wiring region 231b of the third wiring portion 231 and the fourth wiring portion is decreased during the above-described developing process of the photosensitive film, so that it is possible to prevent a migration phenomenon from occurring between the second wiring region 231b of the third wiring portion 231 and the fourth wiring portion, or a short-circuit by connecting the second wiring region 231b of the third wiring portion 231 and the fourth wiring portion.

That is, the support force of the photosensitive pattern may be improved, and damage and partial removal of the photosensitive pattern due to the developing process may be minimized by increasing a width of the photosensitive pattern between the second wiring region 231b of the third wiring portion 231 and the fourth wiring portion.

A flexible printed circuit board according to an embodiment may prevent migration of adjacent wiring portions or short circuit of adjacent wiring portions.

In detail, it is possible to prevent migration or short circuit between the third wiring portion of the third circuit pattern portion to which current and voltage are transmitted by application of power among the plurality of wiring portions and the fourth wiring portion adjacent to the third wiring portion, that is, the dummy wiring portion.

The third wiring portion is a wiring portion that transmits power to the display panel, and may be formed to have a relatively large line width compared to other wiring portions in order to prevent cracks in the wiring portion.

Accordingly, in the process of developing the photosensitive film in the region in which the third wiring portion is formed, the concentration and intensity of the developer may be higher than in the region in which other wiring portions are formed, whereby part or all of the photosensitive film remaining between the third wiring portion and the fourth wiring portion may be damaged.

As a result, the distance between the third wiring portion and the fourth wiring portion may be narrowed, so that migration of the third wiring portion and the fourth wiring portion may occur or the third wiring portion and the fourth wiring portion may be short-circuited.

Therefore, in the flexible printed circuit board according to the embodiment, by making the distance between the third wiring portion and the fourth wiring portion larger than the distance between other wiring portions, that is, by increasing the width of the photosensitive film remaining between the third wiring portion and the fourth wiring portion, it is possible to prevent the photosensitive film from being damaged during the developing process.

Accordingly, it is possible to easily form a gap between the wiring portions to be implemented, and it is possible to prevent migration or short circuit from occurring between the wiring portion having a large line width and the wiring portion having a small line width.

Figure 8:
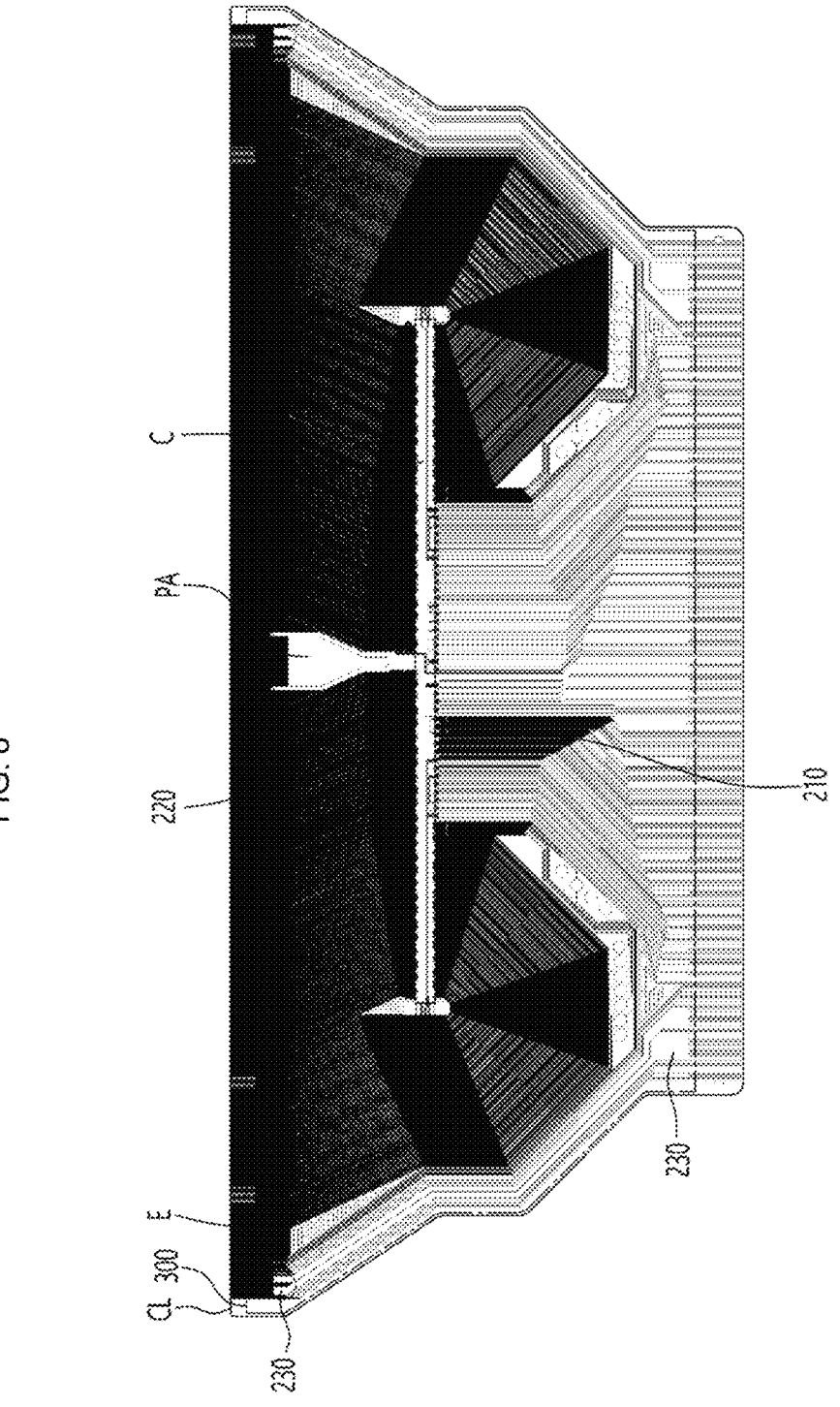
FIG. 8 is a top view of a COF module according to an embodiment.

FIG. 8 is a view showing a top view of a COF module according to an embodiment.

Referring to FIG. 8, the COF module according to the embodiment may include the flexible printed circuit board described above and the chip C disposed in the chip mounting region CA of the flexible printed circuit board 1000.

In addition, the protective layer 300 described above may be disposed on the flexible printed circuit board 1000, and the protective layer 300 may be disposed to expose pad portions of the circuit patterns.

Meanwhile, the COF module may be manufactured by cutting the non-pattern region NPA of the flexible printed circuit board 1000 and then mounting the chip C. In detail, after cutting the cutting line CL between the pattern region PA and the non-pattern region NPA of FIG. 1, a COF module 2000 may be manufactured, in which a driving chip electrically connected to the first circuit pattern and the second circuit pattern and disposed in the chip mounting region of the flexible printed circuit board is mounted.

The COF module may be positioned between the display panel and the substrate to connect an electrical signal.

That is, pad portions of the first circuit pattern and the second circuit pattern that are exposed without the protective layer 300 being disposed may be connected to the display panel and the printed circuit board, and the third circuit pattern in the chip mounting region may be connected to the chip.

Figure 9:
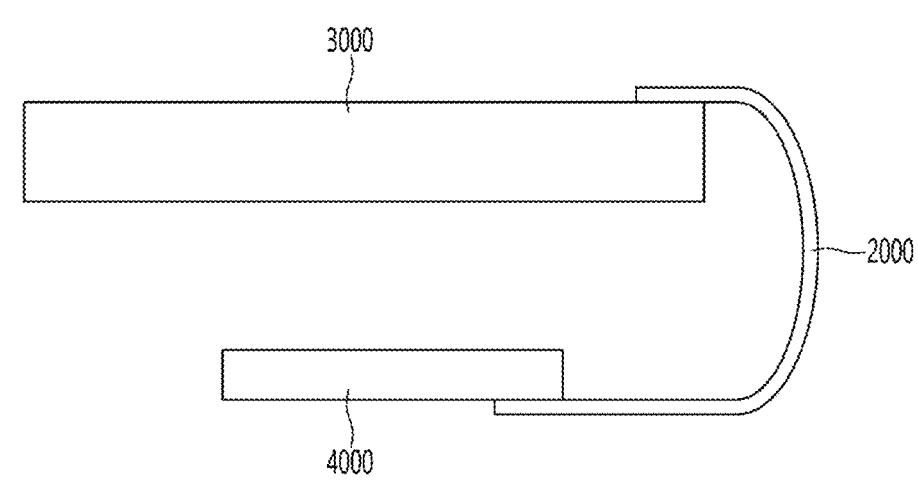
FIG. 9 is a cross-sectional view showing a connection relationship of the COF module including the flexible printed circuit board according to the embodiment.

Referring to FIG. 9, one end of the COF module 2000 including the flexible printed circuit board according to the embodiment may be connected to a display panel 3000, and the other end opposite to the one end may be connected to a printed circuit board 4000.

For example, one end of the COF module 2000 including the flexible printed circuit board according to the embodiment may be electrically connected by being in contact with the display panel 3000, and the other end opposite to the one end may be electrically connected by being in contact with the printed circuit board 4000. Here, the contact may refer to a direct contact. Alternatively, it may refer to contacting with an anisotropic conductive film (ACF) interposed therebetween.

As an example, the ACF may be disposed between the COF module 2000 and the printed circuit board 4000. The COF module 2000 and the printed circuit board 4000 may be electrically connected while being bonded by the ACF. The ACF may be a resin in which conductive particles are dispersed. Therefore, the electrical signal connected by the printed circuit board 4000 may be transmitted to the COF module 2000 through the conductive particles included in the ACF.

Since the COF module 2000 includes a flexible substrate, it may have a rigid shape or a bent shape between the display panel 3000 and the printed circuit board 4000.

The COF module 2000 may connect between the display panel 3000 and the printed circuit board 4000 disposed opposite to each other in a bent shape, thereby reducing a thickness of the electronic device and improving the degree of freedom in design. In addition, since the COF module 2000 including the flexible substrate may not be disconnected even in the bent shape, the reliability of the electronic device including the COF module may be improved.

Since the COF module is flexible, it may be used in various electronic devices.

Figure 10:
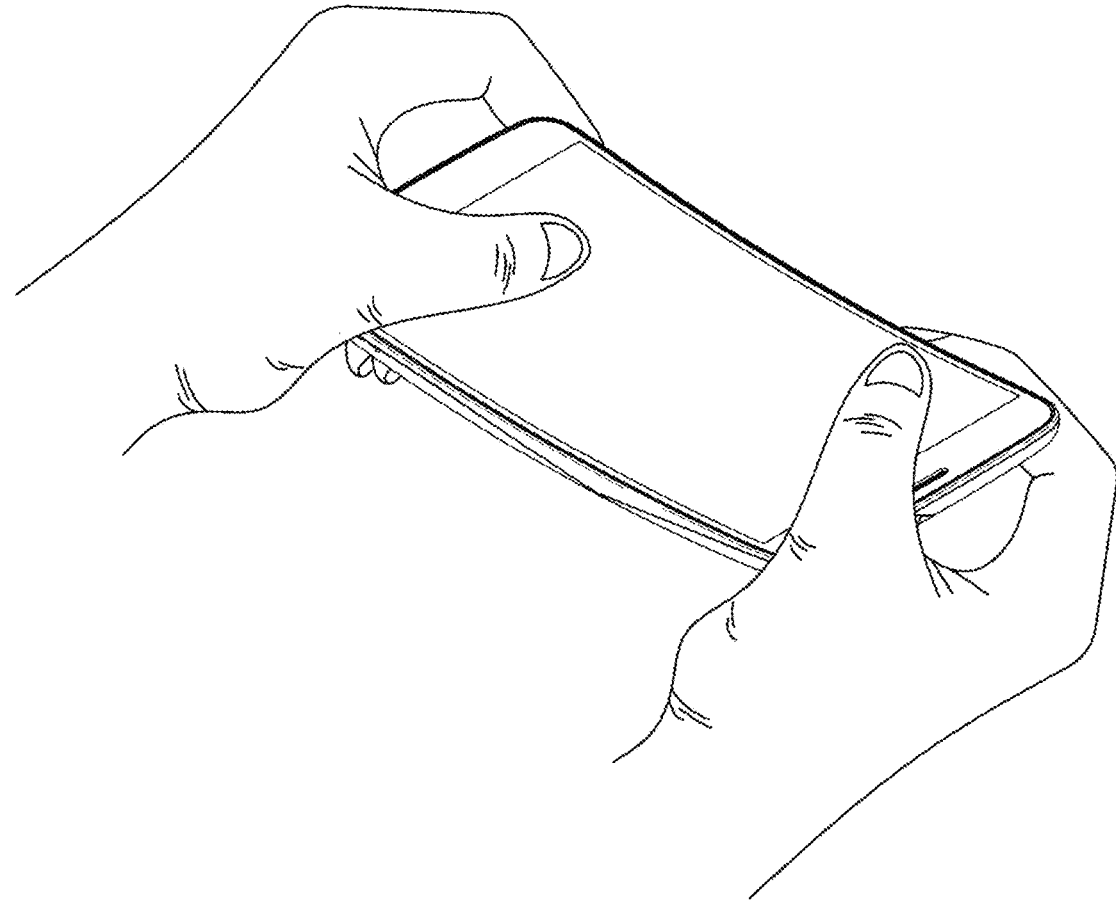
FIGS. 10 to 12 are views of an electronic device including the flexible printed circuit board according to the embodiment.

For example, referring to FIG. 10, the COF module may be included in a bendable flexible touch window. Therefore, a touch device including the same may be a flexible touch device. Therefore, a user may bend or fold it by hand. Such a flexible touch window may be applied to a wearable touch or the like.

Figure 11:
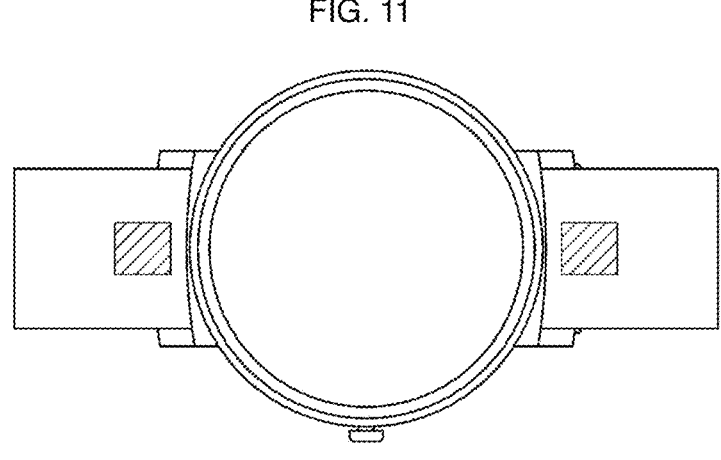

Referring to FIG. 11, the COF module may be included in various wearable touch devices including a curved display. Therefore, an electronic device including the COF module may be reduced in thickness or weight.

Figure 12:
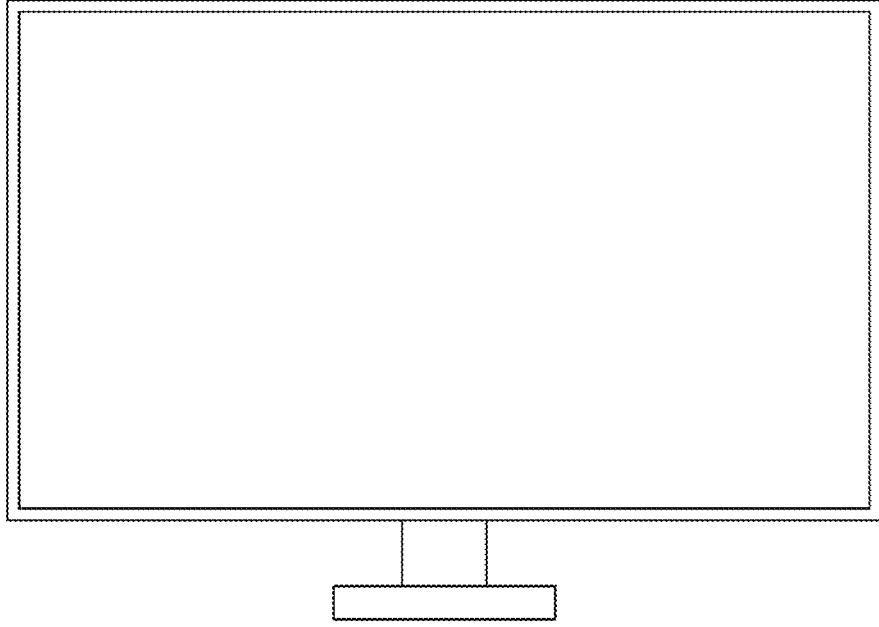

Referring to FIG. 12, the COF module may be used for various electronic devices having a display portion such as a TV, a monitor, and a laptop. In this case, the COF module may be used for an electronic device having a curved-shaped display portion.

However, the embodiment is not limited thereto, and of course, such a COF flexible printed circuit board and a COF module obtained by processing the same may be used for various electronic devices.

The characteristics, structures and effects described in the embodiments above are included in at least one embodiment but are not limited to one embodiment. Furthermore, the characteristic, structure, and effect illustrated in each embodiment may be combined or modified for other embodiments by a person skilled in the art. Thus, it should be construed that contents related to such a combination and such a modification are included in the scope of the present disclosure.

In addition, embodiments are mostly described above, but the embodiments are merely examples and do not limit the present disclosure, and a person skilled in the art may appreciate that several variations and applications not presented above may be made without departing from the essential characteristic of embodiments. For example, each component specifically represented in the embodiments may be varied. In addition, it should be construed that differences related to such a variation and such an application are included in the scope of the present disclosure defined in the following claims.

Technical Problem

An embodiment is directed to providing a flexible printed circuit board having improved reliability, a COF module, and an electronic device including the same.

Technical Solution

A flexible printed circuit board according to an embodiment includes: a substrate; and a circuit pattern disposed on the substrate, wherein the circuit pattern includes a plurality of first circuit patterns, a plurality of second circuit patterns, and a plurality of third circuit patterns, wherein the third circuit pattern includes a third-first pad portion, a third-second pad portion, and a third wiring portion connecting the third-first pad portion and the third-second pad portion, a plurality of fourth wiring portions are disposed between a plurality of third wiring portions, a line width of the third wiring portion is greater than a line width of the fourth wiring portion, and a distance between the third wiring portion and the fourth wiring portion adjacent to the third wiring portion is greater than a distance between the fourth wiring portions.

Advantageous Effects

A flexible printed circuit board according to an embodiment may prevent migration of adjacent wiring portions or short circuit of adjacent wiring portions.

In detail, it is possible to prevent migration or short circuit between the third wiring portion of the third circuit pattern portion to which current and voltage are transmitted by application of power among the plurality of wiring portions and the fourth wiring portion adjacent to the third wiring portion, that is, the dummy wiring portion.

The third wiring portion is a wiring portion that transmits power to the display panel, and may be formed to have a relatively large line width compared to other wiring portions in order to prevent cracks in the wiring portion.

Accordingly, in the process of developing the photosensitive film in the region in which the third wiring portion is formed, the concentration and intensity of the developer may be higher than in the region in which other wiring portions are formed, whereby part or all of the photosensitive film remaining between the third wiring portion and the fourth wiring portion may be damaged.

Accordingly, the distance between the third wiring portion and the fourth wiring portion may be narrowed, so that migration of the third wiring portion and the fourth wiring portion may occur or the third wiring portion and the fourth wiring portion may be short-circuited.

Therefore, in the flexible printed circuit board according to the embodiment, by making the distance between the third wiring portion and the fourth wiring portion is larger than the distance between other wiring portions, that is, by increasing the width of the photosensitive film remaining between the third wiring portion and the fourth wiring portion, it is possible to prevent the photosensitive film from being damaged during the developing process.

Accordingly, it is possible to easily form a gap between the wiring portions to be implemented, and it is possible to prevent migration or short circuit from occurring between the wiring portion having a large line width and the wiring portion having a small line width.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A flexible printed circuit board comprising:

a substrate;

a plurality of circuit pattern disposed on the substrate; and a plurality of dummy patterns disposed on the substrate, wherein the circuit pattern includes a plurality of first circuit patterns, a plurality of second circuit patterns, and a plurality of third circuit patterns, wherein the first circuit patterns are connected with a chip and a circuit board, wherein the second circuit patterns are connected with the chip and a display panel, wherein the third circuit patterns are connected with the circuit board and the display panel, wherein the third circuit pattern includes a third-first pad portion, a third-second pad portion, and a third wiring portion connecting the third-first pad portion and the third-second pad portion, wherein the dummy patterns are disposed between two adjacent third wiring portions, a line width of the third wiring portion is greater than a line width of the fourth wiring portion, and wherein the third wiring portion includes a first wiring region and a second wiring region that are integrally formed, a line width of the second wiring region is greater than a line width of the first wiring region, and the second wiring region is connected to a plurality of first wiring regions, wherein a minimum distance between the second wiring region and the fourth wiring portion is greater than a distance between adjacent second wiring regions.

2. The flexible printed circuit board of claim 1, wherein the minimum distance between the second wiring region and the fourth wiring portion is greater than a distance between adjacent the fourth wiring portions.

3. The flexible printed circuit board of claim 1, wherein the minimum distance between the second wiring region and the fourth wiring portion is greater than a distance between the first wiring region and the fourth wiring portion.

4. The flexible printed circuit board of claim 1, wherein the minimum distance between the second wiring region and the fourth wiring portion is greater than a distance between adjacent the first wiring region.

5. The flexible printed circuit board of claim 1, wherein the third circuit pattern is a power supply circuit pattern.

6. The flexible printed circuit board of claim 1, wherein the line width of the second wiring region is 30 µm or more.

7. The flexible printed circuit board of claim 1, wherein the line width of the second wiring region is at least twice the line width of the fourth wiring portion.

8. The flexible printed circuit board of claim 1, wherein the minimum distance between the second wiring region and the fourth wiring portion is 1.5 times or more at least one of a distance between adjacent second wiring regions, the distance between adjacent the fourth wiring portions, a distance between the first wiring region and the fourth wiring portion, and a distance between adjacent the first wiring region.

9. The flexible printed circuit board of claim 1, wherein the first circuit pattern includes a first-first pad portion disposed inside a chip mounting region, a first-second pad portion disposed outside the chip mounting region, and a first wiring portion connecting the first-first pad portion and the first-second pad portion, and extends in a first direction based on the chip mounting region, and the second circuit pattern includes a second-first pad portion disposed inside the chip mounting region, a second-second pad portion disposed outside the chip mounting region, and a second wiring portion connecting the second-first pad portion and the second-second pad portion, and extends in a second direction.

10. The flexible printed circuit board of claim 8, wherein the third circuit pattern extends in the first direction and the second direction.

11. The flexible printed circuit board of claim 1, wherein the third circuit pattern includes a region having a line width greater than that of the first circuit pattern and the second circuit pattern.

12. The flexible printed circuit board of claim 1, the second wiring region is a region formed by merging a plurality of first wiring regions.

13. The flexible printed circuit board of claim 1, wherein the line width of the fourth wiring part is less than or equal to the line width of the first wiring region of the third wiring part.

14. A COF module comprising:
the flexible printed circuit board according to claim 1; and
a chip disposed in the chip mounting region.

15. The COF module of claim 14, wherein the minimum distance between the second wiring region and the fourth wiring portion is greater than a distance between adjacent the fourth wiring portions.

16. The COF module of claim 14, wherein the minimum distance between the second wiring region and the fourth wiring portion is greater than a distance between the first wiring region and the fourth wiring portion.

17. The COF module of claim 14, wherein the minimum distance between the second wiring region and the fourth wiring portion is greater than a distance between adjacent the first wiring region.

18. An electronic device comprising:
the COF module according to claim 17;
a printed circuit board connected to the first circuit pattern; and
a display panel connected to the second circuit pattern.

\* \* \* \* \*